(12) United States Patent
Xu et al.

(10) Patent No.: US 11,984,070 B2
(45) Date of Patent: May 14, 2024

(54) DISPLAY SUBSTRATE AND DISPLAY DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Chen Xu, Beijing (CN); Xueguang Hao, Beijing (CN); Yong Qiao, Beijing (CN); Xinyin Wu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 399 days.

(21) Appl. No.: 17/255,502

(22) PCT Filed: Dec. 13, 2019

(86) PCT No.: PCT/CN2019/125243
§ 371 (c)(1),
(2) Date: Dec. 23, 2020

(87) PCT Pub. No.: WO2021/114251
PCT Pub. Date: Jun. 17, 2021

(65) Prior Publication Data
US 2021/0366379 A1    Nov. 25, 2021

(51) Int. Cl.
*G09G 3/3225* (2016.01)
*G09G 3/3266* (2016.01)
*H10K 59/121* (2023.01)

(52) U.S. Cl.
CPC .......... *G09G 3/3225* (2013.01); *G09G 3/3266* (2013.01); *H10K 59/1213* (2023.02);
(Continued)

(58) Field of Classification Search
CPC .............. G09G 3/3225; G09G 3/3266; G09G 2300/0426; G09G 2300/043;
(Continued)

(56) References Cited

U.S. PATENT DOCUMENTS

2006/0077195 A1* 4/2006 Kageyama ........... G09G 3/3233
                                                                              345/204
2018/0061854 A1* 3/2018 Ono ..................... G09G 3/3696
(Continued)

FOREIGN PATENT DOCUMENTS

CN    107331338 A  * 11/2017  .............. G09G 3/006
CN    109087922 A  * 12/2018  ......... H01L 23/5221
(Continued)

OTHER PUBLICATIONS

Japan Patent Office, JP2021-571721 First Office Action dated Sep. 4, 2023.
(Continued)

*Primary Examiner* — Stephen G Sherman
(74) *Attorney, Agent, or Firm* — HOUTTEMAN LAW LLC

(57) ABSTRACT

The present disclosure provides a display substrate, in which power lines and compensation detection lines are alternately arranged at intervals, and two columns of pixel driving circuits extending along a second direction are arranged between any one of the power lines and one adjacent compensation detection line; and for any one of a plurality of pixel driving circuits, a power input terminal of the pixel driving circuit is electrically connected to the power line closest to the pixel driving circuit, and a compensation detection signal terminal of the pixel driving circuit is electrically connected to the compensation detection line closest to the pixel driving circuit. The present disclosure further provides a display device.

13 Claims, 6 Drawing Sheets

(52) U.S. Cl.
CPC . H10K 59/1216 (2023.02); *G09G 2300/0426* (2013.01); *G09G 2300/043* (2013.01); *G09G 2330/021* (2013.01)

(58) Field of Classification Search
CPC ..... G09G 2330/021; G09G 2300/0819; G09G 2300/0861; G09G 2310/0262; G09G 3/3233; G09G 2300/0852; H01L 27/3262; H01L 27/3265; H01L 27/3276
See application file for complete search history.

(56) References Cited

U.S. PATENT DOCUMENTS

| | | | |
|---|---|---|---|
| 2018/0061908 A1 | 3/2018 | Shim et al. | |
| 2018/0114485 A1 | 4/2018 | Kim et al. | |
| 2018/0151126 A1 | 5/2018 | Jeong et al. | |
| 2018/0151658 A1 | 5/2018 | Jeong et al. | |
| 2018/0151661 A1 | 5/2018 | Oh et al. | |
| 2019/0066561 A1* | 2/2019 | Yuan | G09G 3/20 |
| 2019/0131369 A1 | 5/2019 | Choi | |
| 2019/0172873 A1 | 6/2019 | Ji et al. | |
| 2019/0173057 A1 | 6/2019 | Jung et al. | |
| 2020/0091193 A1* | 3/2020 | Ren | H01L 27/1248 |
| 2021/0091159 A1* | 3/2021 | Lee | H01L 27/3276 |

FOREIGN PATENT DOCUMENTS

| | | |
|---|---|---|
| KR | 20180024314 A | 3/2018 |
| KR | 20190048569 A | 5/2019 |

OTHER PUBLICATIONS

European Patent Office, EP19945456.2 Supplementary Partial European Search Report dated Aug. 7, 2023.
Japanese Patent Office, JP2021-571721 Second Office Action issued on Dec. 18, 2023.
European Patent Office, EP19945456.2 Extended European Search Report issued on Dec. 8, 2023.

* cited by examiner

DISPLAY SUBSTRATE AND DISPLAY DEVICE

CROSS-REFERENCE TO RELATED APPLICATIONS

This is a National Phase Application filed under 35 U.S.C. 371 as a national stage of PCT/CN2019/125243, filed on Dec. 13, 2019, the content of each of which is hereby incorporated by reference in its entirety.

TECHNICAL FIELD

The present disclosure relates to the field of display technology, and in particular, to a display substrate and a display device.

BACKGROUND

Organic light emitting diode (OLED) display technology has gradually matured. There is a need to further improve the resolution of OLED display devices, so the lines in the display substrates of the OLED display devices are required to be finer and finer.

However, the width of a power line cannot be reduced infinitely, which hinders the improvement in the resolution of the OLED display devices.

SUMMARY

The present disclosure provides a display substrate and a display device.

In a first aspect, there is provided a display substrate including: a base substrate and a display functional layer disposed on the base substrate. The display functional layer includes: a plurality of pixel driving circuits arranged in a first direction and a second direction which intersect, a plurality of power lines extending along the second direction, a plurality of compensation detection lines extending along the second direction, a plurality of gate lines extending along the first direction, a plurality of data lines extending along the second direction, and a plurality of compensation scan lines extending along the first direction. The power lines and the compensation detection lines are alternately arranged at intervals, and two columns of pixel driving circuits extending along the second direction are arranged between any one of the power lines and one adjacent compensation detection line; and in any one of the plurality of pixel driving circuits, a power input terminal of the pixel driving circuit is electrically connected to the power line closest to the pixel driving circuit, and a compensation detection signal terminal of the pixel driving circuit is electrically connected to the compensation detection line closest to the pixel driving circuit.

In some embodiments, for two columns of pixel driving circuits located between one power line and one adjacent compensation detection line, in any pixel driving circuit in the column of pixel driving circuits close to the power line, a power input terminal of the pixel driving circuit is directly connected to the power line closest to the pixel driving circuit, and a compensation detection signal terminal of the pixel driving circuit is connected to the compensation detection line closest to the pixel driving circuit through a compensation detection bridge line; and in any pixel driving circuit in the column of pixel driving circuits close to the compensation detection line, a power input terminal of the pixel driving circuit is connected to the power line closest to the pixel driving circuit through a power bridge line, and a compensation detection signal terminal of the pixel driving circuit is directly connected to the compensation detection line closest to the pixel driving circuit.

In some embodiments, for the two columns of pixel driving circuits located between one power line and one adjacent compensation detection line, two data lines are disposed between the two columns of pixel driving circuits; and for any pixel driving circuit of the two columns of pixel driving circuits, a data signal input terminal of the pixel driving circuit is connected to one of the data lines closest to the pixel driving circuit.

In some embodiments, the display substrate further includes a light-shielding pattern located between the base substrate and the display functional layer, the power bridge line and the compensation detection bridge line being disposed in the same layer as the light-shielding pattern; the power bridge line is connected with the corresponding power line and the corresponding power input terminal through via holes; and the compensation detection bridge line is connected with the corresponding compensation detection line and the corresponding compensation detection signal terminal through via holes.

In some embodiments, any two adjacent power lines are electrically connected to each other through a first conductive bridge line extending along the first direction.

In some embodiments, the display substrate further includes a plurality of light emitting devices connected to the pixel driving circuits in one-to-one correspondence. The light emitting device includes a first electrode, a light-emitting layer, and a second electrode that are sequentially stacked along a direction away from the base substrate; and the first conductive bridge line is disposed on the same layer as the first electrode.

In some embodiments, any two adjacent compensation detection lines are electrically connected to each other through a second conductive bridge line extending along the first direction.

In some embodiments, the display substrate further includes a plurality of light emitting devices connected to the pixel driving circuits in one-to-one correspondence. The light emitting device includes a first electrode, a light-emitting layer, and a second electrode that are sequentially stacked along a direction away from the base substrate; and the second conductive bridge line is disposed in the same layer as the first electrode.

In some embodiments, end portions of at least part of the power lines are connected to a same power bus.

In some embodiments, the power bus is disposed in the same layer as the gate line.

In some embodiments, the pixel driving circuit includes a driving transistor, a switching transistor, a detection transistor, and a storage capacitor. A gate electrode of the switching transistor is connected to a corresponding one of the gate lines, a first electrode of the switching transistor is connected to a corresponding data signal input terminal, and a second electrode of the switching transistor is connected to a gate electrode of the driving transistor and a first electrode of the storage capacitor; a first electrode of the driving transistor is connected to a corresponding power input terminal, and a second electrode of the driving transistor is connected to a second electrode of the storage capacitor and a first electrode of the detection transistor; and a gate electrode of the detection transistor is connected to a corresponding compensation scan line, and a second electrode of the detection transistor is connected to a corresponding compensation detection signal terminal.

In some embodiments, the driving transistor, the switching transistor, and the detection transistor are all top-gate transistors; the first electrode of the storage capacitor is in the same layer as active layers of the driving transistor, the switching transistor, and the detection transistor; and the second electrode of the storage capacitor includes a first portion and a second portion, the first portion being the light-shielding pattern, the second portion being in the same layer as the first electrode of the driving transistor and electrically connected to the first electrode of the driving transistor, and the first portion and the second portion being electrically connected to each other.

In some embodiments, the display substrate further includes a plurality of light emitting devices connected to the pixel driving circuits in one-to-one correspondence. The light emitting device includes a first electrode, a light-emitting layer, and a second electrode that are sequentially stacked along a direction away from the base substrate; and the second electrode of the storage capacitor further comprises a third portion in the same layer as the first electrode of the light emitting device and electrically connected to the first portion.

In a second aspect, a display device is provided, and includes the display substrate provided in the first aspect of the present disclosure.

Figure 1:
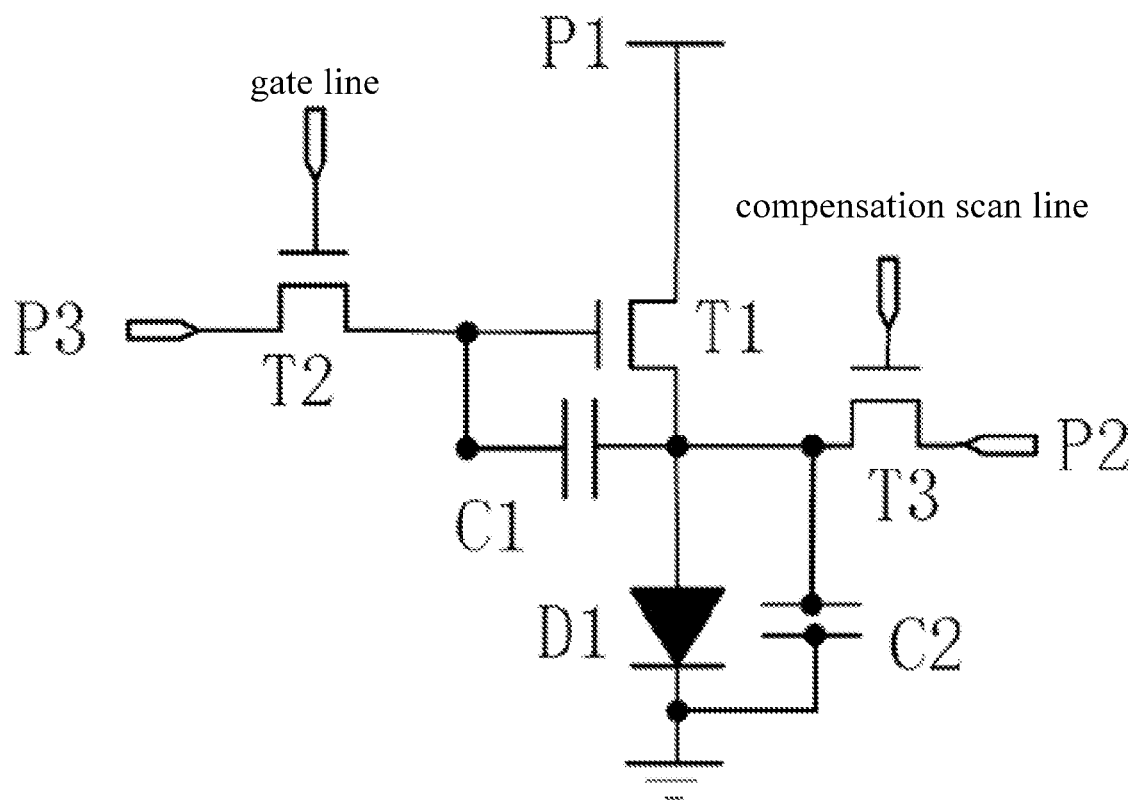
FIG. 1 is a circuit diagram of a pixel driving circuit in a display substrate according to the embodiments of the present disclosure.

In the drawings, the referential numbers represent: 100-substrate; DR1-first direction; DR2-second direction; 1-pixel driving circuit; VDD-power line; Sense-compensation detection line; Vdata-data line; GL-gate line; P1-power input terminal; P2-compensation detection signal terminal; P3-data signal input terminal; T1-driving transistor; T2-switching transistor; T3-detection transistor; C1-storage capacitor; C2-equivalent capacitance of light emitting device; D1-light emitting device; BR1-power bridge line; BR2-compensation detection bridge line; BR3-first conductive bridge line; BR4-second conductive bridge line; VDD-BUS-power bus; V1-first via; V2-second via; V3-third via; V4-fourth via; V5-fifth via; V6-sixth via; V7-seventh via; V8-eighth via; V9-ninth via; V10-tenth via; T1g-gate electrode of driving transistor; Cb1-first portion of second electrode of storage capacitor; Cb2-second portion of second electrode of storage capacitor; Ca-first electrode of storage capacitor; T2g-gate electrode of switching transistor; T2a-gate insulating layer of switching transistor; T2b-active layer of switching transistor.

DETAILED DESCRIPTION

In order to enable those skilled in the art to better understand the technical solutions of the present disclosure, the present disclosure is further described below in detail with reference to the accompanying drawings and specific embodiments.

In the present disclosure, disposing two structures "in the same layer" indicates that the two structures are formed from the same material layer and thus are located in the same layer in terms of stacking relationship, but does not mean that a distance between one of the two structures and a base substrate is the same as that between the other one and the base substrate, or other layer structures between one of the two structures and the base substrate are completely the same as those between the other one and the base substrate.

In the present disclosure, "a patterning process" refers to steps of forming a structure having a specific pattern, and may be a photolithography process including one or more steps of forming a material layer, coating a photoresist, exposing, developing, etching, and stripping off the photoresist. The "patterning process" may also be other processes such as an imprinting process and an inkjet printing process.

With reference to FIGS. 1 to 7, the embodiments of the present disclosure provide a display substrate, including: a base substrate 100 and a display functional layer disposed on the base substrate 100. The display functional layer includes: a plurality of pixel driving circuits 1 arranged in a first direction DR1 and a second direction DR2 which intersect, a plurality of power lines VDD extending along the second direction DR2, a plurality of compensation detection lines Sense extending along the second direction DR2, a plurality of gate lines GL extending along the first direction DR1, a plurality of data lines Vdata extending along the second direction DR2, and a plurality of compensation scan lines (not shown) extending along the first direction DR1. The power lines VDD and the compensation detection lines Sense are alternately arranged at intervals, and two columns of pixel driving circuits 1 extending along the second direction DR2 are arranged between any one of the power lines VDD and one adjacent compensation detection line Sense; and in any one of the plurality of pixel driving circuits 1, a power input terminal P1 of the pixel driving circuit 1 is electrically connected to the power line VDD closest to the pixel driving circuit 1, and a compensation detection signal terminal P2 of the pixel driving circuit 1 is electrically connected to the compensation detection line Sense closest to the pixel driving circuit 1. Specifically, the display substrate is, for example, an OLED display substrate, or a quantum dot LED display substrate.

With reference to FIG. 1, in some embodiments, a pixel driving circuit 1 includes a driving transistor T1, a switching transistor T2, a detection transistor T3, and a storage capacitor C1. A gate electrode of the switching transistor T2 is connected to a corresponding gate line GL, a first electrode of the switching transistor T2 is connected to a corresponding data signal input terminal P3, and a second electrode of the switching transistor T2 is connected to a gate electrode of the driving transistor T1 and a first electrode of the storage capacitor C1; a first electrode of the driving transistor T1 is connected to a corresponding power input terminal P1, and a second electrode of the driving transistor T1 is connected to a second electrode of the storage capacitor C1 and a first electrode of the detection transistor T3; and a gate electrode of the detection transistor T3 is connected to a corresponding compensation scan line, and a second electrode of the detection transistor T3 is connected to a corresponding compensation detection signal terminal P2.

With reference to FIG. 1, a light emitting device D1 is, for example, an OLED or a quantum dot LED, and the equivalent capacitance of the light emitting device D1 is referred to as capacitance C2.

In other embodiments, the pixel driving circuit 1 may further include additional transistors, for example, an emission control transistor (not shown) connected in series between the power input terminal P1 and the first electrode of the driving transistor T1 to control whether to turn on or off the light emitting device D1.

As an example, the first direction DR1 is a row direction and the second direction DR2 is a column direction in the following description.

For example, each gate line GL is electrically connected to the gate electrodes of the switching transistors T2 of a row of pixel driving circuits 1, and each data line Vdata is electrically connected to the first electrodes of the switching transistors T2 of a column of pixel driving circuits 1, so that the switching transistors T2 of the row of pixel driving circuits 1 are turned on when the gate line GL is applied with an effective voltage, so as to allow the data lines Vdata to write a data voltage to the gate electrodes of the corresponding driving transistors T1 of the row of pixel driving circuits and store the data voltage in the first electrodes of the storage capacitors C1.

For example, each compensation scan line is electrically connected to the gate electrodes of the detection transistors T3 of a row of pixel driving circuits 1, and each compensation detection line Sense is electrically connected to the compensation detection signal terminals P2 of a column of pixel driving circuits 1, so that the compensation detection transistors T3 of the row of pixel driving circuits 1 are turned on when the compensation scan line is applied with an effective voltage, so that a voltage of the second electrodes of the storage capacitors C1 may be read through the compensation detection line Sense, or the voltage of the second electrodes of the storage capacitors C1 may be compensated through the compensation detection line Sense.

With reference to FIG. 1, the voltage of the second electrode of the storage capacitor C1 is an anode voltage of an LED.

Figure 2:
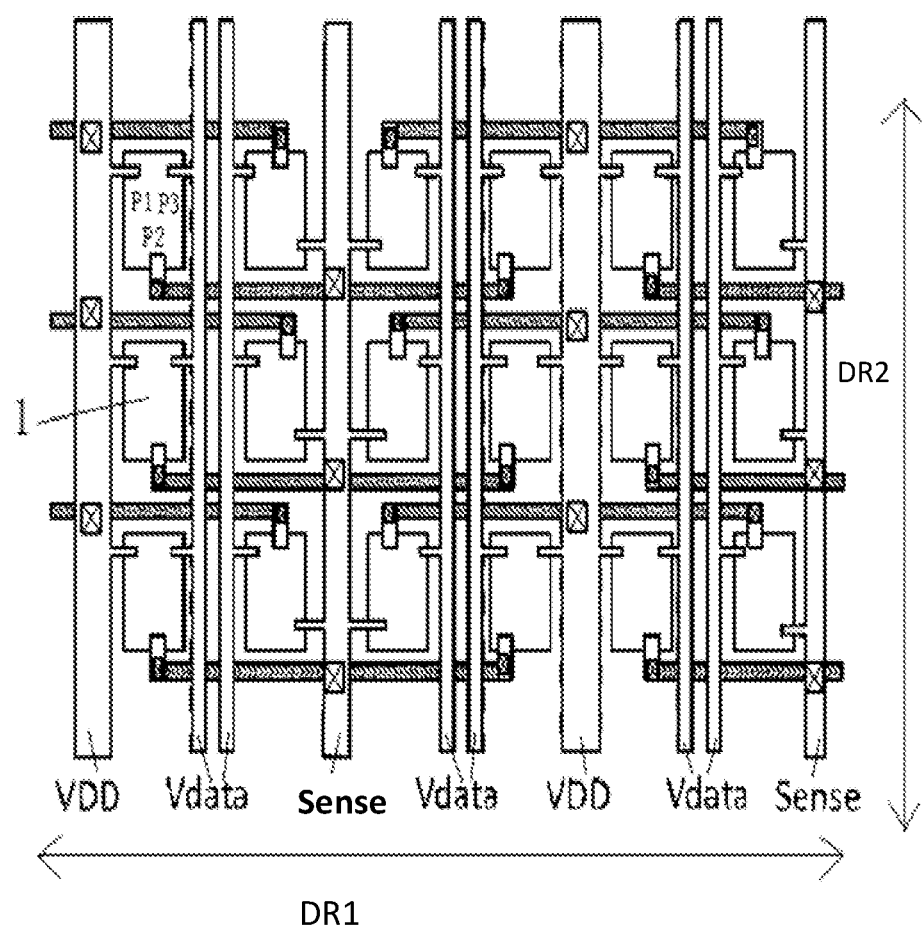
FIG. 2 is a layout of a display substrate according to some embodiments of the present disclosure.
Figure 3:
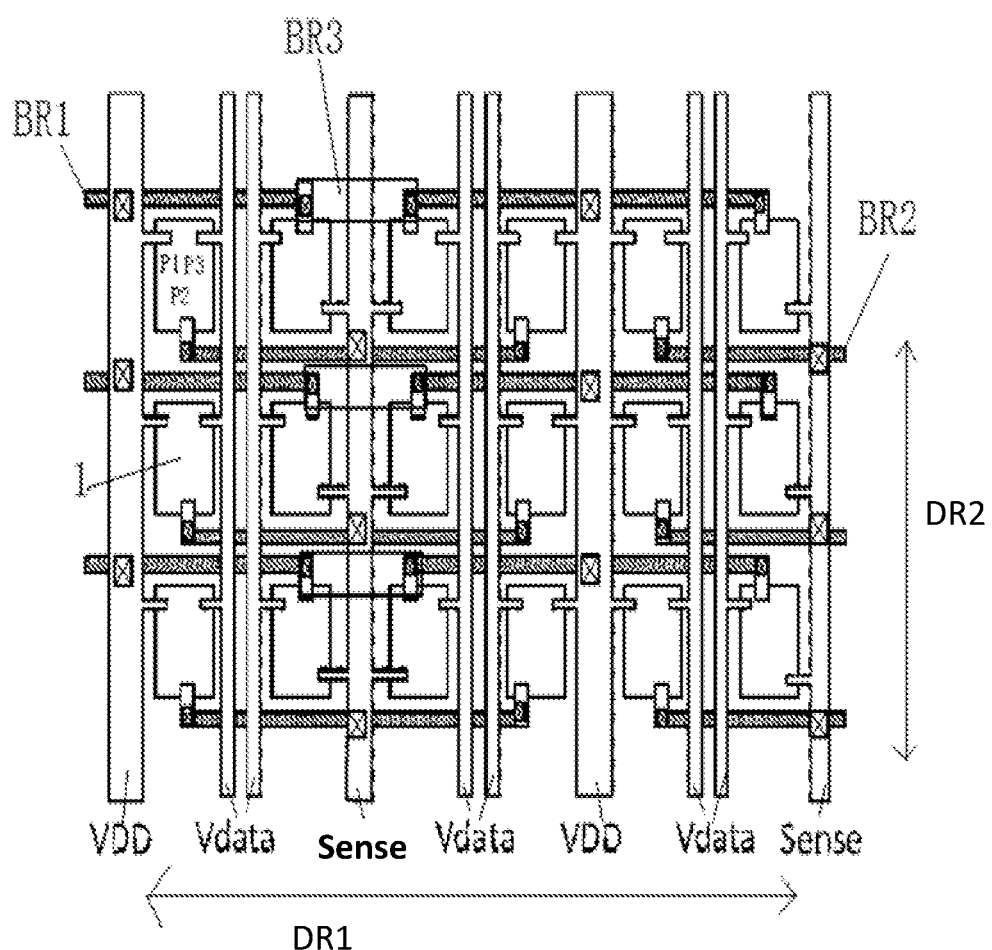
FIG. 3 is a layout of a display substrate according to some other embodiments of the present disclosure.

With reference to FIG. 2, in the embodiments of the present disclosure, a power line VDD extending along the column direction, a column of pixel driving circuits 1, two data lines Vdata extending along the column direction, a column of pixel driving circuits 1, a compensation detection line Sense extending along the column direction, a column of pixel driving circuits 1, two data lines Vdata, and a column of pixel driving circuits 1 are sequentially arranged along the row direction.

One power line VDD supplies power to four columns of pixel driving circuits 1 that are close to the power line VDD, which is also referred to as "one for four".

One compensation detection line Sense is electrically connected to four columns of pixel driving circuits 1 that are close to the compensation detection line Sense, and simultaneously detects or compensates four pixel driving circuits 1 that are adjacent in the row direction.

The detection or compensation performed by the compensation detection lines Sense to the pixel driving circuits 1 may be performed according to the prior art.

One data line Vdata supplies a data voltage signal to a column of pixel driving circuits 1 that is closest to the data line Vdata.

Since no data lines Vdata or compensation detection lines Sense is are provided on two sides of a power line VDD in the row direction, the power line VDD may be set to be such thick such that the voltage drop thereof is can be acceptable even in the case of "one for four".

Since no adjacent data line Vdata or power line VDD is provided on two sides of a compensation detection line Sense in the row direction, the compensation detection line Sense has low requirement of the equivalent resistance of its own, and one compensation detection line Sense is electrically connected to four columns of pixel driving circuits 1, the number of the compensation detection lines Sense is reduced.

The area occupied by the power lines VDD and the compensation detection lines Sense are reduced due to the above two factors, which facilitates the improvement in display resolution.

In some embodiments, with reference to FIG. 2, for two columns of pixel driving circuits 1 located between one power line VDD and one adjacent compensation detection line Sense, in any pixel driving circuit 1 in the column of pixel driving circuits 1 close to the power line VDD, a power input terminal P1 of the pixel driving circuit 1 is directly connected to the power line VDD closest to the pixel driving circuit 1, and a compensation detection signal terminal P2 of the pixel driving circuit 1 is connected to the compensation detection line Sense closest to the pixel driving circuit 1 through a compensation detection bridge line BR2; and in any pixel driving circuit 1 in the column of pixel driving circuits 1 close to the compensation detection line Sense, a power input terminal P1 of the pixel driving circuit 1 is connected to the power line VDD closest to the pixel driving circuit 1 through a power bridge line BR1, and a compensation detection signal terminal P2 of the pixel driving circuit 1 is directly connected to the compensation detection line Sense closest to the pixel driving circuit 1.

In other words, the power line VDD is directly connected to the power input terminals P1 of the pixel driving circuits 1 that are closest to the power line VDD, and is electrically connected to the second closest pixel driving circuits 1 through the power bridge lines BR1; and the compensation detection line Sense is directly connected to the compensation detection signal terminals P2 of the pixel driving circuits 1 closest to the compensation detection line Sense, and is electrically connected to the second closest pixel driving circuits 1 through the compensation detection bridge lines BR2.

Obviously, the compensation detection bridge lines BR2 and the compensation detection lines Sense belong to different layer structures, and the power bridge lines BR1 and the power lines VDD belong to different layer structures.

In some embodiments, with reference to FIG. 2, for the two columns of pixel driving circuits 1 located between one power line VDD and one adjacent compensation detection line Sense, two data lines Vdata are disposed between the two columns of pixel driving circuits 1; and for any pixel driving circuit 1 of the two columns of pixel driving circuits 1, a data signal input terminal P3 of the pixel driving circuit 1 is connected to the data line Vdata closest to the pixel driving circuit 1.

That is, every two data lines Vdata are disposed between two columns of pixel driving circuits 1. In this way, the size of the data line Vdata in the row direction may be further reduced.

In some other embodiments, the data lines Vdata may be arranged along the row direction in such an order of one column of pixel driving circuits 1, one data line Vdata, and so on.

Figure 6:
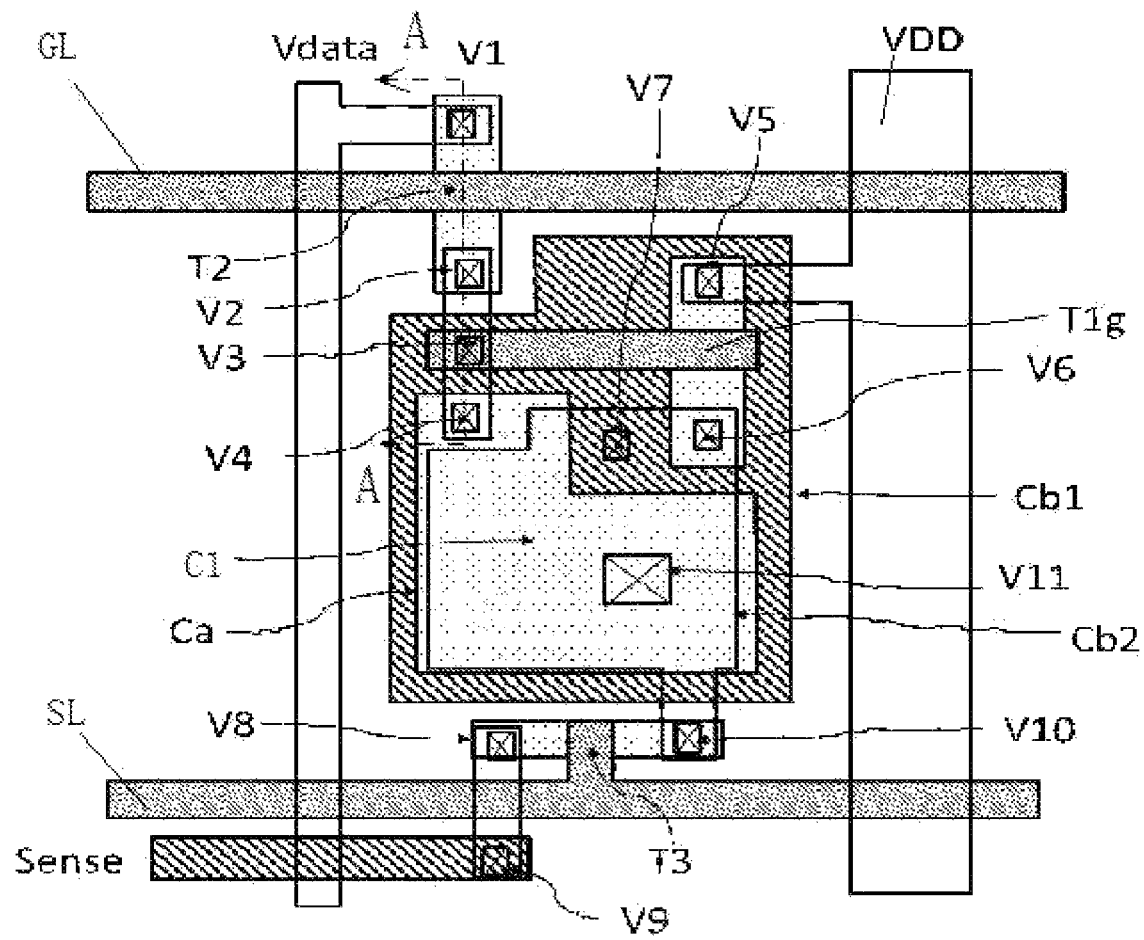
FIG. 6 is a layout of a pixel driving circuit according to some embodiments of the present disclosure.
Figure 7:
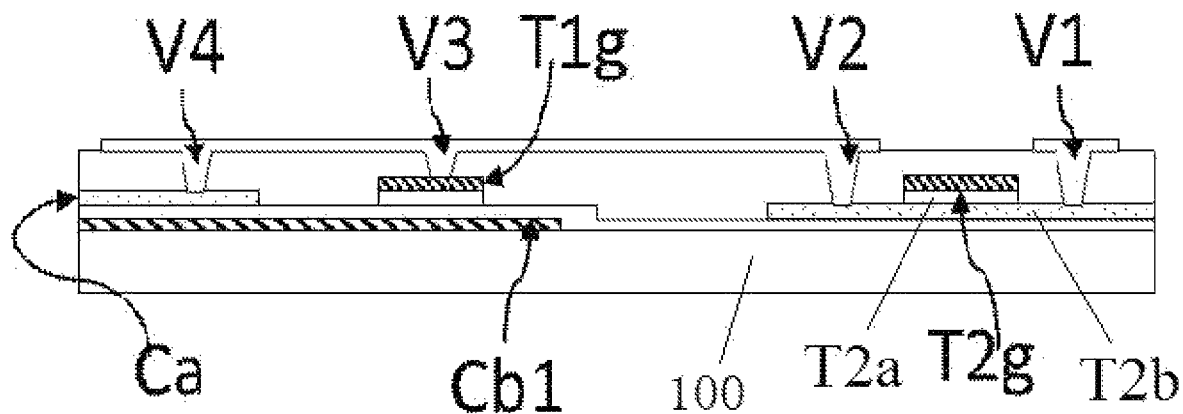
FIG. 7 is a sectional view of the layout of FIG. 6 along line AA.

In some embodiments, with reference to FIGS. 6 and 7, each pixel in the display substrate includes a light-shielding pattern Cb1 located between the base substrate 100 and the display functional layer, the power bridge line BR1 and the compensation detection bridge line BR2 being disposed in the same layer as the light-shielding pattern. The power bridge line BR1 is connected with the corresponding power line VDD and the corresponding power input terminal P1 through vias; and the compensation detection bridge line BR2 is connected with the corresponding compensation detection line Sense and the corresponding compensation detection signal terminal P2 through vias.

The light-shielding pattern is configured to block the light from one a side of the base substrate 100, so as to prevent the degradation properties of the active layers of the transistors above on the light-shielding pattern from being degraded due to the light.

As such, the light-shielding patterns, the power bridge lines BR1 and the compensation detection bridge lines BR2 may be formed in the same patterning process, without increasing the number of masks required for manufacturing the display substrate.

In some embodiments, any two adjacent power lines VDD are electrically connected to each other through a first conductive bridge line BR3 extending along the first direction DR1.

As such, the equivalent resistance of the power line VDD may be reduced.

The first conductive bridge line BR3 may be disposed in one individual layer, or may be disposed in the same layer as the other structures of the display substrate.

In some embodiments, the display substrate further includes a plurality of light emitting devices D1 connected to the pixel driving circuits 1 in one-to-one correspondence. The light emitting device D1 includes a first electrode, a light-emitting layer, and a second electrode that are sequentially stacked along a direction away from the base substrate 100; and the first conductive bridge line BR3 is disposed in the same layer as the first electrode.

The light-emitting layer is, for example, an organic light-emitting layer or a quantum dot light-emitting layer. A hole injection layer, a hole transport layer, an electron injection layer, an electron transport layer and the like may be arranged between the light-emitting layer and the first and second electrodes, which are not specifically limited in the present disclosure.

In this way, the first conductive bridge lines BR3 may be formed simultaneously in the patterning process in which the first electrodes are formed, which reduces the number of the masks.

Figure 4:
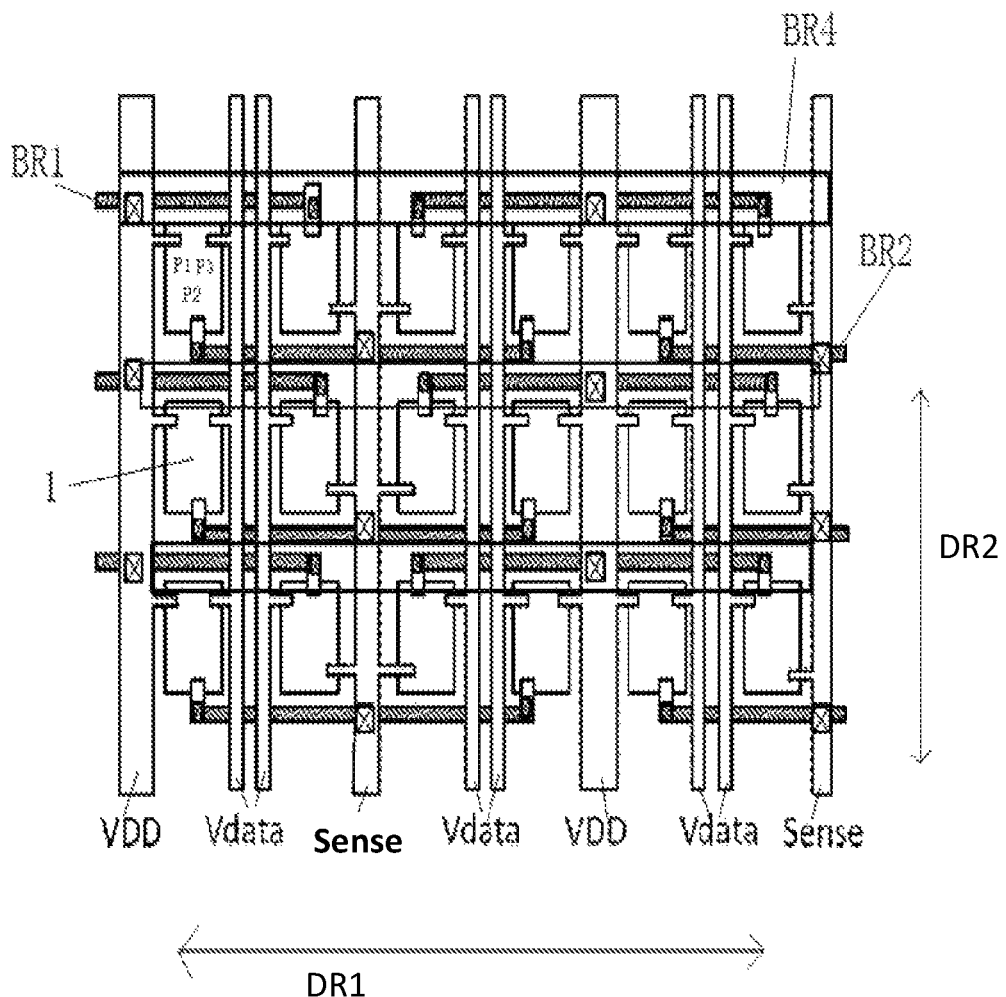
FIG. 4 is a layout of a display substrate according to some other embodiments of the present disclosure.

In some embodiments, with reference to FIG. 4, any two adjacent compensation detection lines Sense are electrically connected to each other through a second conductive bridge line BR4 extending along the first direction DR1.

As such, the equivalent resistance of the compensation detection line Sense may be reduced.

The second conductive bridge line BR4 may be disposed in one on individual a layer independently, or may be disposed in the same layer as the other structures of the display substrate.

In some embodiments, the display substrate further includes a plurality of light emitting devices D1 connected to the pixel driving circuits 1 in one-to-one correspondence. The light emitting device D1 includes a first electrode, a light-emitting layer, and a second electrode that are sequentially stacked along a direction away from the base substrate 100; and the second conductive bridge line BR4 is disposed in the same layer as the first electrode.

In this way, the second conductive bridge lines BR4 may be formed simultaneously in the patterning process in which the first electrodes are formed, which reduces the number of the masks.

Figure 5:
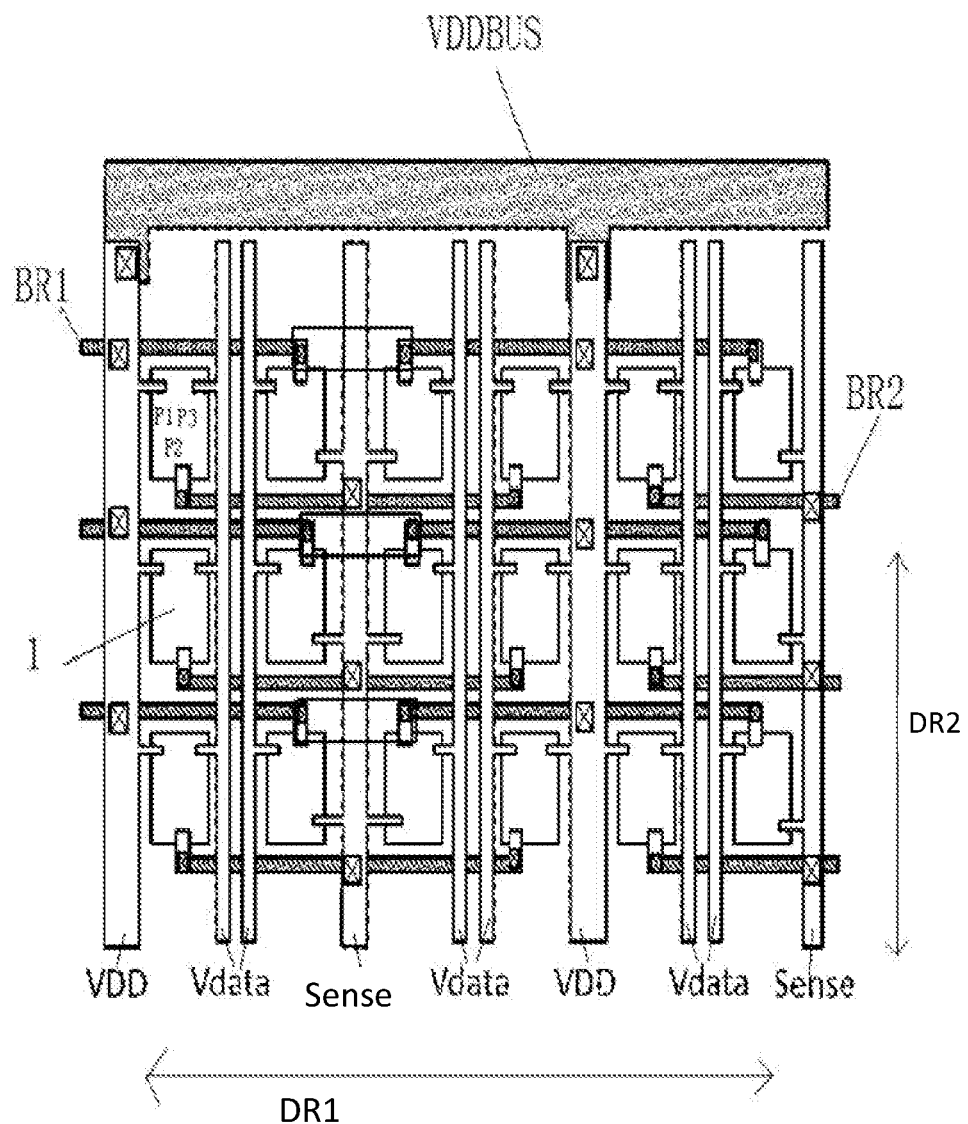
FIG. 5 is a layout of a display substrate according to some other embodiments of the present disclosure.

In some embodiments, with reference to FIG. 5, the ends of at least part of the power lines VDD are connected to a same power bus VDDBUS, which can laterally and electrically connect a plurality of power lines VDD, so as to reduce the overall resistance of the power lines VDD.

One or more power buses VDDBUS are arranged in the display substrate, and a driving chip for driving of the display substrate is driven to provides the same power voltage as possible for the the power buses VDDBUS with power voltages that are substantially equal to each other.

The above arrangement may improve the uniformity of the voltages of the power lines VDD.

In some embodiments, the power bus VDDBUS is disposed in the same layer as the gate line GL.

That is, in the patterning process in which the gate lines GL are formed, the power bus VDDBUS is simultaneously formed from the same material layer, which does not increase the number of the masks.

In some embodiments, with reference to FIGS. 6 and 7, the driving transistor T1, the switching transistor T2, and the detection transistor T3 are all top-gate transistors; the first electrode Ca of the storage capacitor C1 is disposed in the same layer as the active layers of the driving transistor T1, the switching transistor T2, and the detection transistor T3; the second electrode of the storage capacitor C1 includes a first portion Cb1 which is the light-shielding pattern, and a second portion Cb2 which is disposed in the same layer as the first electrode of the driving transistor T1 and electrically connected to the first electrode of the driving transistor T1, and the first portion and the second portion are electrically connected to each other to have the same potential.

An active layer, a gate insulating layer, and a gate electrode of the top-gate transistor are sequentially stacked in a direction away from the base substrate 100.

With reference to FIG. 7, the gate electrode T2g of the switching transistor T2 is farther from the base substrate 100 than the gate insulating layer T2a of the switching transistor T2.

The storage capacitor C1 includes the first portion Cb1, the first electrode Ca, and the second portion Cb2 located in a direction away from the base substrate 100.

In the storage capacitor C1, first equivalent capacitance is formed between the first portion Cb1 of the second electrode and the first electrode Ca, second equivalent capacitance is formed between the second portion Cb2 of the second electrode and the first electrode Ca, and a capacitance value of the storage capacitor C1 is the sum of the first equivalent capacitance and the second equivalent capacitance. Thus, the capacitance value of the storage capacitor C1 is increased, which facilitates improving the stability of the brightness of each light emitting device D1.

The detailed connection relationship is as follows: the first electrode of the switching transistor T2 is electrically connected to the corresponding data line Vdata through a first via V1; the second electrode of the switching transistor T2 is electrically connected to the gate electrode T1g of the corresponding driving transistor T1 through a second via V2 and a third via V3, and is electrically connected to the first electrode Ca of the corresponding storage capacitor C1 through a fourth via V4; one electrode of the driving transistor T1 (its gate electrode T1g is shown in FIG. 6) is electrically connected to the corresponding power line VDD through a fifth via V5, and another electrode of the driving transistor T1 is electrically connected to the second portion Cb2 of the second electrode of the corresponding storage capacitor C1 through a sixth via V6; the first portion Cb1 and the second portion Cb2 of the second electrode of the storage capacitor C1 are electrically connected to each other through a seventh via V7; and one electrode of the detection transistor T3 is electrically connected to the corresponding compensation detection line Sense through an eighth via V8 and a ninth via V9, and another electrode of the detection transistor T3 is electrically connected to the second portion Cb2 of the second electrode of the corresponding storage capacitor C1 through a tenth via V10.

In some embodiments, the display substrate further includes a plurality of light emitting devices D1 connected to the pixel driving circuits 1 in one-to-one correspondence. The light emitting device D1 includes a first electrode (not shown), a light-emitting layer (not shown), and a second electrode (not shown) that are sequentially stacked along a direction away from the base substrate 100; and the second electrode of the storage capacitor C1 further includes a third portion which is disposed in the same layer as the first electrode of the light emitting device D1, and is electrically connected to the first portion.

The first electrode of the light emitting device D1 is farther from the base substrate than the second portion Cb2.

Furthermore, third equivalent capacitance may be formed between the third portion of the second electrode of the storage capacitor C1 and the first electrode Ca of the storage capacitor C1, and the third equivalent capacitance is connected in parallel with the first equivalent capacitance and the second equivalent capacitance, so as to further increase an equivalent capacitance value of the storage capacitor C1.

In some embodiments, the base substrate 100 is, for example, an insulator substrate such as a glass substrate, a quartz substrate and a sapphire substrate, or a semiconductor substrate such as a silicon substrate, a germanium substrate, a silicon carbide substrate and an indium phosphide substrate; or, the base substrate 100 may be made of a flexible or stretchable material, such as polyester, polyamide and polyimide.

In some embodiments, the active layers of the transistors, such as the active layer T2b of the switching transistor T2, may be made of metal oxide, silicon (including strained silicon), germanium, silicon-germanium, silicon carbide, gallium arsenide, aluminum gallium arsenide, indium phosphide, gallium nitride or organic semiconductor.

In the embodiments, the metal oxide may be an oxide containing indium and tin, an oxide containing tungsten and indium, an oxide containing tungsten, indium and zinc, an oxide containing titanium and indium, an oxide containing titanium, indium and tin, an oxide containing indium and zinc, an oxide containing silicon, indium and tin, an oxide containing indium, gallium and zinc, or the like.

The metal oxide may be an oxide semiconductor containing indium (In), so as to improve carrier mobility (electron mobility). In addition, in some embodiments, the oxide semiconductor is an oxide semiconductor containing element M. In some embodiments, the element M is aluminum, gallium, yttrium, or tin. Other elements that can be used as the element M are: boron, silicon, titanium, iron, nickel, germanium, yttrium, zirconium, molybdenum, lanthanum, cerium, neodymium, hafnium, tantalum, and tungsten. It should be noted that a combination of a plurality of the above elements may be used as the element M. The element M is, for example, an element having high bond energy with oxygen. The element M is an element whose bond energy with oxygen is higher than that of indium. Or, the element M is, for example, an element capable of increasing an energy gap of an oxide semiconductor. Furthermore, in some embodiments, the metal oxide contains zinc (Zn), because an oxide semiconductor containing zinc is easily crystallized. In practical application, the oxide semiconductor is not limited to an oxide semiconductor containing indium, and may be an indium-free oxide semiconductor containing zinc, gallium or tin, such as a zinc tin oxide or a gallium tin oxide.

In the case where the metal oxide is an In-M-Zn oxide and a sum of an atomic percentage of In and an atomic percentage of M is 100 atomic %, in some embodiments, the atomic percentage of In is less than 50 atomic % and the atomic percentage of M is greater than 50 atomic %. The metal oxide is an oxide having a large energy gap, for example, equal to or greater than 2.5 eV and equal to or less than 4.2 eV, and in some embodiments, equal to or greater than 2.8 eV and equal to or less than 3.8 eV, and in some embodiments, equal to or greater than 3 eV and equal to or less than 3.5 eV. In some embodiments—the metal oxide is an oxide containing indium (In), M and zinc (Zn), M being aluminum (Al), gallium (Ga) or tin (Sn).

In the embodiments, the composition of the active layers of the three transistors in the pixel driving circuit may be the same or substantially the same, so as to reduce manufacturing cost. However, the embodiments are not limited thereto, and the composition of the active layers of the three transistors may also be different from one another. When each of the active layers of the three transistors has a region where an atomic percentage of In is greater than that of M, the field-effect mobility of the switching transistor and that of the driving transistor may be improved. Specifically, the field-effect mobility of the switching transistor or/and the field-effect mobility of the driving transistor may exceed 10 cm2/Vs, and in some embodiments, exceed 30 cm2/Vs. For example, when the transistor with high field-effect mobility is used in a gate driver of a display device to generate a gate signal, the display device may be implemented to have narrow bezels. When the transistor with high field-effect mobility is used in a source driver of a display device to provide a signal transmitted from a signal line, the number of the wires connected to the display device may be reduced. When the transistor with high field-effect mobility is used as a transistor of a pixel circuit of a display device, display quality of the display device may be improved.

Further, the metal oxide in the embodiments may be single-layered, double-layered or multi-layered. In the case where the metal oxide is double-layered, the metal oxide includes a first oxide layer and a second oxide layer that are stacked. The conductivity of the second oxide layer may be lower than that of the first oxide layer and a band gap of the second oxide layer may be larger than that of the first oxide layer. The first oxide layer may be a main channel layer for electron movement and thus may be disposed close to a gate electrode of each transistor. When the metal oxide is single-layered, in some embodiments, the metal oxide is made of an indium gallium zinc oxide (IGZO).

In the embodiments, a part of the metal oxide serves as an active layer of a transistor, and the other part serves as an electrode of a storage capacitor. Thus, when a process for realizing conductivity is performed, on one hand, directions and shapes of channels for different sub-pixels may be made different from one another to adapt to different aspect ratios, for example, an aspect ratio of a channel of the switching transistor is made less than that of a channel of the driving transistor by designing the widths of the active layer of the switching transistor and the active layer of the driving transistor; on the other hand, the composition content of the metal oxide in different regions of one sub-pixel may be different, so as to adapt to different requirements of electrical characteristics.

The above-mentioned process for realizing conductivity means that, after a pattern of the gate electrode of each transistor is formed, the metal oxide is processed to become conductive by performing plasma treatment with the gate electrode used as a mask, so as to process the metal oxide in corresponding regions to be a conductive layer. The metal oxide may be divided into three regions: a first region, including an area overlapping the gate electrode of the transistor, and serving as a channel region of the transistor; a second region, including an area adjacent to the first region, i.e., the area that is adjacent to the gate electrode of the transistor but is not covered by the gate electrode of the transistor, and serving as a source-drain region of the transistor; and a third region, including as plate area of the storage capacitor. In the embodiments, the composition of IGZO in the three regions is different. In the embodiments, the oxygen content of the first region is within a range of 30 atomic % to 50 atomic %, the oxygen content of the second region is within a range of 50 atomic % to 60 atomic %, and the oxygen content of the third region is within a range of 60 atomic % to 70 atomic %. In some embodiments, the oxygen content of IGZO of the first region is less than that of the second region, and the oxygen content of IGZO of the second region is less than that of the third region. The zinc content of IGZO of the first region is greater than the zinc content of IGZO of the second region, and the zinc content of IGZO of the second region is greater than that of the third region. Moreover, the atomic ratio of oxygen to zinc, O/Zn, of the first region is less than that of the second region, and O/Zn of the second region is less than that of the third region. In addition, the oxide in the first region mainly exhibits semiconductor characteristics. The applicant found that the carrier concentration can be obviously increased by increasing the In content. Therefore, in order to increase the carrier concentration of the first region to enhance the driving capability of the transistor, the In atom content of the first region is greater than that of the second region, and the In atom content of the second region is greater than that of the third region.

An example of the composition of IGZO in the three regions is shown in the following table, where Weight % represents a weight proportion of an element in IGZO and Atomic % represents an atomic percentage of an element in IGZO.

| Element | First region | | Second region | | Third region | |
|---|---|---|---|---|---|---|
| | Weight (%) | Atomic (%) | Weight (%) | Atomic (%) | Weight (%) | Atomic (%) |
| Oxygen (O) | 11.82 | 40.24 | 19.47 | 55.39 | 23.35 | 60.94 |
| Zinc (Zn) | 25.68 | 21.40 | 19.61 | 13.65 | 18.72 | 11.95 |
| Gallium (Ga) | 28.38 | 22.18 | 26.51 | 17.31 | 25.66 | 15.37 |
| Indium (In) | 34.12 | 16.18 | 34.4 | 13.63 | 32.24 | 11.72 |

The first region is a channel region of at least one of the three transistors, the second region is a source-drain region of at least one of the three transistors, and the third region is a plate area of the storage capacitor. As shown in the above table, IGZO contains oxygen (O), zinc (Zn), gallium (Ga), and indium (In). The first region is not subjected to plasma treatment because it is blocked by the gate electrode, a ratio of O:Zn:Ga:In by weight of the first region is 11.82:25.68:28.38:34.12, and an atomic content ratio of O:Zn:Ga:In of the first region is 40.24:21.40:22.18:16.18. The third region is subjected to plasma treatment because it is not blocked, a ratio of O:Zn:Ga:In by weight of the third region is 23.35:18.72:25.66:32.24, and an atomic content ratio of O:Zn:Ga:In of the third region is 60.94:11.95:15.37:11.72. After the third region is subjected to plasma treatment, the weight and the atomic content of oxygen in IGZO of the third region are greatly increased, the weight and the atomic content of zinc (Zn) of the third region are reduced, so that the conductivity of IGZO is improved. Although the second region is not blocked by the gate electrode, the second region is still affected by the gate electrode because it is close to the gate electrode. The weight and the atomic content of oxygen in IGZO of the second region are less than those of the third region, and the weight and the atomic content of zinc (Zn) of IGZO of the second region are greater than those of the third region, so that the conductivity of IGZO in the second region is lower than that of IGZO in the third region.

Being used as a first electrode of the storage capacitor, the metal oxide layer in the third region needs to have good conductivity, that is, it needs to be processed to become conductive very well. Theoretically, when a region is subjected to plasma treatment with the gate electrode used as a mask, the farther the region is from the gate electrode, the better the region is processed, the better the conductivity of the region is. Therefore, it is set in the embodiments that a minimum distance between the metal oxide layer (capacitor plate Ca) in the third region and the gate electrode T1$g$ of the driving transistor is greater than L1, a minimum distance between the capacitor plate Ca and the gate electrode T2$g$ of the switching transistor is greater than L2, a minimum distance between the capacitor plate Ca and the gate electrode T3$g$ of the detection transistor is greater than L3, where L1 is a width of the gate electrode T1$g$ of the driving transistor, L2 is a width of the gate electrode T2$g$ of the switching transistor, and L3 is a width of the gate electrode T3$g$ of the detection transistor. In this way, the plasma treatment performed on the metal oxide layer in the third region is not affected by the gate electrode T1$g$ of the driving transistor, the gate electrode T2$g$ of the switching transistor, and the gate electrode T3$g$ of the detection transistor. It should be noted that the above distances are distances in a direction perpendicular to the substrate. In a modified embodiment, among the condition where the minimum distance between the metal oxide layer (Ca) in the third region and the gate electrode T1$g$ of the driving transistor is greater than L1, the condition where the minimum distance between the capacitor plate Ca and the gate electrode T2$g$ of the switching transistor is greater than L2, and the condition where the minimum distance between the capacitor plate Ca and the gate electrode T3$g$ of the detection transistor is greater than L3, one or two of the conditions may be satisfied for designing a high-resolution backplane. Furthermore, in some embodiments, the above conditions may be satisfied, with a priority, for a pattern of the capacitor plate Ca overlapping the first electrode and the second electrode. L1 is the width of the gate electrode T1$g$ of the driving transistor, L2 is the width of the gate electrode T2$g$ of the switching transistor, and L3 is the width of the gate electrode T3$g$ of the detection transistor. In this way, the plasma treatment performed to the metal oxide layer in the third region is less affected by the gate electrode T1$g$ of the driving transistor, the gate electrode T2$g$ of the switching transistor, and the gate electrode T3$g$ of the detection transistor, so that the conductivity of the metal oxide layer in the third region is improved to the greatest content.

In some embodiments, a gate insulating layer and other insulating structures of each transistor, such as the gate insulating layer T2a of the switching transistor T2, may be made of silicon oxide (SiOx), silicon nitride (SiNx), (silicon oxynitride) SiON or the like, and may also be aluminum oxide (AlOx), hafnium oxide (HfOx), tantalum oxide (TaOx), yttrium oxide, zirconium oxide, gallium oxide, magnesium oxide, lanthanum oxide, cerium oxide, neodymium oxide or the like. A thickness of a first insulating layer is 3000 Å-5000 Å, a thickness of the gate insulating layer is 1000 Å-2000 Å, and a thickness of a second insulating layer is 4500 Å-7000 Å.

In some embodiments, a material of the power line VDD, the compensation detection line Sense, the data line Vdata, the gate line GL, the power bridge line BR1, and the compensation detection bridge line BR2 may be an alloy or a compound, and may also be a conductor containing aluminum, a conductor containing copper and titanium, a conductor containing copper and manganese, a conductor containing indium, tin and oxygen, or a conductor containing titanium and nitrogen. For example, the material of those lines is chromium (Cr), gold (Au), zinc (Zn), silver (Ag), copper (Cu), aluminum (Al), molybdenum (Mo), tantalum (Ta), titanium (Ti), tungsten (W), manganese (Mn), nickel (Ni), iron (Fe), cobalt (Co), or an alloy containing one or a combination of the above metal elements, such as aluminum neodymium alloy (AlNd), molybdenum niobium alloy (MoNb), and may be multilayer metal such as Mo/Cu/Mo. In some embodiments, a Cu—X alloy film (X is Mn, Ni, Cr, Fe, Co, Mo, Ta or Ti) is adopted, because the Cu—X alloy film can be processed by a wet etching process, which may reduce the manufacturing cost. In some embodiments, a Cu—Mn alloy film is adopted. A thickness of a first metal layer is 800 Å-1200 Å, a thickness of a gate metal layer is 3000 Å-5000 Å, and a thickness of a second metal layer is 3000 Å-9000 Å.

The embodiments of the present disclosure further provide a display device, including the above display substrate.

Specifically, the display device is any product or component having a display function, such as an OLED display panel, a quantum dot LED display panel, a mobile phone, and a computer.

An OLED in the OLED display panel may include an anode electrode, a hole transport layer, an organic light-emitting layer, an electron transport layer, and a cathode electrode.

A quantum dot LED in the quantum dot LED display panel may include an anode electrode, a quantum dot light-emitting layer, and a cathode electrode.

It should be understood that the above embodiments are merely exemplary embodiments employed to illustrate the principles of the present disclosure, and the present disclosure is not limited thereto. Without departing from the spirit and essence of the present disclosure, those skilled in the art may make various changes and modifications, and those changes and modifications should be considered to fall within the scope of the present disclosure.

What is claimed is:

1. A display substrate, comprising:
a base substrate and a display functional layer on the base substrate,
wherein the display functional layer comprises: a plurality of pixel driving circuits arranged in a first direction and a second direction intersecting with the first direction, a plurality of power lines extending along the second direction, a plurality of compensation detection lines extending along the second direction, a plurality of gate lines extending along the first direction, a plurality of data lines extending along the second direction, and a plurality of compensation scan lines extending along the first direction;

the power lines and the compensation detection lines are alternately arranged at intervals, and two columns of the pixel driving circuits extending along the second direction are arranged between any one of the power lines and an adjacent one of the compensation detection lines; and in any one of the plurality of pixel driving circuits, a power input terminal of the pixel driving circuit is electrically connected to one of the power lines closest to the pixel driving circuit, and a compensation detection signal terminal of the pixel driving circuit is electrically connected to one of the compensation detection lines closest to the pixel driving circuit, for two columns of pixel driving circuits between one power line and one adjacent compensation detection line, a power input terminal of any pixel driving circuit in the column of pixel driving circuits close to the compensation detection line is directly connected to the power line closest to the pixel driving circuit, and a power input terminal of any pixel driving circuit in the other column of pixel driving circuits among the two columns of pixel driving circuits is connected to the power line through a power bridge line, the power bridge line and the power line belonging to different layer structures, and the power bridge line extending in the first direction and being between two rows of pixel driving circuits each extending in the first direction, wherein any two adjacent power lines of the plurality of power lines are electrically connected to each other through the power bridge line and a first conductive bridge line belonging to a layer structure different from the power bridge, the first conductive bridge line extending along the first direction and crossing one of the compensation detection lines located between the two adjacent power lines to electrically connect two portions of the power bridge line that are separated from each other.

2. The display substrate of claim 1, wherein for two columns of pixel driving circuits between one power line and one adjacent compensation detection line,
in any pixel driving circuit in the column of pixel driving circuits close to the one power line, a compensation detection signal terminal of the pixel driving circuit is connected to the compensation detection line closest to the pixel driving circuit through a compensation detection bridge line; and in any pixel driving circuit in the column of pixel driving circuits close to the compensation detection line, a compensation detection signal terminal of the pixel driving circuit is directly connected to the compensation detection line closest to the pixel driving circuit.

3. The display substrate of claim 2, wherein for the two columns of pixel driving circuits between one power line and one adjacent compensation detection line, two of the data lines are between the two columns of pixel driving circuits; and for any pixel driving circuit of the two columns of pixel driving circuits, a data signal input terminal of the pixel driving circuit is connected to one of the data lines closest to the pixel driving circuit.

4. The display substrate of claim 2, further comprising: a light-shielding pattern between the base substrate and the display functional layer, wherein the power bridge line and the compensation detection bridge line are in the same layer as the light-shielding pattern;
- the power bridge line is connected with the corresponding power line and the corresponding power input terminal through via holes; and
- the compensation detection bridge line is connected with the corresponding compensation detection line and the corresponding compensation detection signal terminal through via holes.

5. The display substrate of claim 1, further comprising a plurality of light emitting devices connected to the pixel driving circuits in one-to-one correspondence, wherein the light emitting device comprises a first electrode, a light-emitting layer, and a second electrode that are sequentially stacked along a direction away from the base substrate; and
- the first conductive bridge line is disposed on the same layer as the first electrode.

6. The display substrate of claim 1, wherein any two adjacent compensation detection lines are electrically connected to each other through a second conductive bridge line extending along the first direction.

7. The display substrate of claim 6, further comprising a plurality of light emitting devices connected to the pixel driving circuits in one-to-one correspondence, wherein the light emitting device comprises a first electrode, a light-emitting layer, and a second electrode that are sequentially stacked along a direction away from the base substrate; and
- the second conductive bridge line is in the same layer as the first electrode.

8. The display substrate of claim 1, wherein end portions of at least part of the power lines are connected to a same power bus.

9. The display substrate of claim 8, wherein the power bus is in the same layer as the gate line.

10. The display substrate of claim 1, wherein the pixel driving circuit comprises a driving transistor, a switching transistor, a detection transistor, and a storage capacitor; a gate electrode of the switching transistor is connected to a corresponding one of the gate lines, a first electrode of the switching transistor is connected to a corresponding data signal input terminal, and a second electrode of the switching transistor is connected to a gate electrode of the driving transistor and a first electrode of the storage capacitor; a first electrode of the driving transistor is connected to a corresponding power input terminal, and a second electrode of the driving transistor is connected to a second electrode of the storage capacitor and a first electrode of the detection transistor; and a gate electrode of the detection transistor is connected to a corresponding compensation scan line, and a second electrode of the detection transistor is connected to a corresponding compensation detection signal terminal.

11. The display substrate of claim 10, wherein the driving transistor, the switching transistor, and the detection transistor are all top-gate transistors;
- the first electrode of the storage capacitor is in the same layer as active layers of the driving transistor, the switching transistor, and the detection transistor; and
- the second electrode of the storage capacitor comprises a first portion and a second portion, the first portion being the light-shielding pattern, the second portion being in the same layer as the first electrode of the driving transistor and electrically connected to the first electrode of the driving transistor, and the first portion and the second portion being electrically connected to each other.

12. The display substrate of claim 11, further comprising a plurality of light emitting devices connected to the pixel driving circuits in one-to-one correspondence, wherein the light emitting device comprises a first electrode, a light-emitting layer, and a second electrode that are sequentially stacked along a direction away from the base substrate; and
- the second electrode of the storage capacitor further comprises a third portion in the same layer as the first electrode of the light emitting device and electrically connected to the first portion.

13. A display device, comprising the display substrate of claim 1.

* * * * *